United States Patent
Ko et al.

(10) Patent No.: US 9,847,353 B2
(45) Date of Patent: Dec. 19, 2017

(54) METHOD OF MAKING LIQUID CRYSTAL DISPLAY DEVICE WITH OXIDE THIN FILM TRANSISTOR

(71) Applicant: LG DISPLAY CO., LTD., Seoul (KR)

(72) Inventors: Dong Kug Ko, Goyang-si (KR); Jong Sang Pyo, Goyang-si (KR); Ji Yong Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/493,952

(22) Filed: Apr. 21, 2017

(65) Prior Publication Data
US 2017/0229487 A1    Aug. 10, 2017

Related U.S. Application Data

(62) Division of application No. 14/937,574, filed on Nov. 10, 2015, now Pat. No. 9,666,603.

(30) Foreign Application Priority Data

Dec. 31, 2014    (KR) ........................ 10-2014-0195832

(51) Int. Cl.
| | |
|---|---|
| H01L 21/00 | (2006.01) |
| H01L 27/12 | (2006.01) |
| H01L 29/66 | (2006.01) |
| H01L 29/786 | (2006.01) |
| H01L 29/24 | (2006.01) |
| G02F 1/1345 | (2006.01) |

(Continued)

(52) U.S. Cl.
CPC ........ *H01L 27/1225* (2013.01); *G02F 1/1368* (2013.01); *G02F 1/13458* (2013.01); *G02F 1/133345* (2013.01); *G02F 1/136286* (2013.01); *H01L 27/127* (2013.01); *H01L 27/1244* (2013.01); *H01L 29/24* (2013.01); *H01L 29/66969* (2013.01); *H01L 29/78693* (2013.01); *G02F 2001/13629* (2013.01); *G02F 2202/10* (2013.01)

(58) Field of Classification Search
CPC ............. H01L 29/7869; H01L 27/1225; H01L 29/66969; H01L 27/124; G02F 1/1368
USPC ..................................... 438/48, 85
See application file for complete search history.

(56) References Cited

U.S. PATENT DOCUMENTS

2005/0077524 A1* 4/2005 Ahn ..................... G02F 1/13458
                                                                       257/72
2006/0290865 A1   12/2006 Choi et al.
(Continued)

*Primary Examiner* — Andy Huynh
(74) *Attorney, Agent, or Firm* — Birch, Stewart, Kolasch & Birch, LLP

(57) ABSTRACT

A method of making a display device includes, providing a substrate having a display area and a pad area in a periphery of the display area, the display area including a plurality of pixel regions; forming a thin film transistor having a channel layer on the substrate; arranging a gate link line and a first common voltage line to cross each other, and having a first insulation film be interposed therebetween; arranging a second common voltage line and a data link line to cross each other, and having second insulation film be interposed therebetween; disposing a first pattern on the first insulation film; and disposing a second pattern on the second insulation film, wherein the channel layer, the first pattern and the second pattern are formed of the same material.

7 Claims, 12 Drawing Sheets

< REGION B >

< REGION C >

(51) Int. Cl.
*G02F 1/1368* (2006.01)
*G02F 1/1362* (2006.01)
*G02F 1/1333* (2006.01)

(56) References Cited

U.S. PATENT DOCUMENTS

| | | | |
|---|---|---|---|
| 2009/0096258 A1* | 4/2009 | Kim | B60K 35/00 297/188.17 |
| 2009/0225249 A1 | 9/2009 | Wang et al. | |
| 2010/0002180 A1* | 1/2010 | Kim | G02F 1/13452 349/143 |
| 2010/0079717 A1* | 4/2010 | Park | G02F 1/1345 349/152 |
| 2012/0268396 A1* | 10/2012 | Kim | G06F 3/0412 345/173 |
| 2014/0055715 A1 | 2/2014 | Lee et al. | |
| 2015/0060778 A1 | 3/2015 | Kim et al. | |

\* cited by examiner

< PAD REGION >    < PIXEL REGION >

< PAD REGION >    < PIXEL REGION >

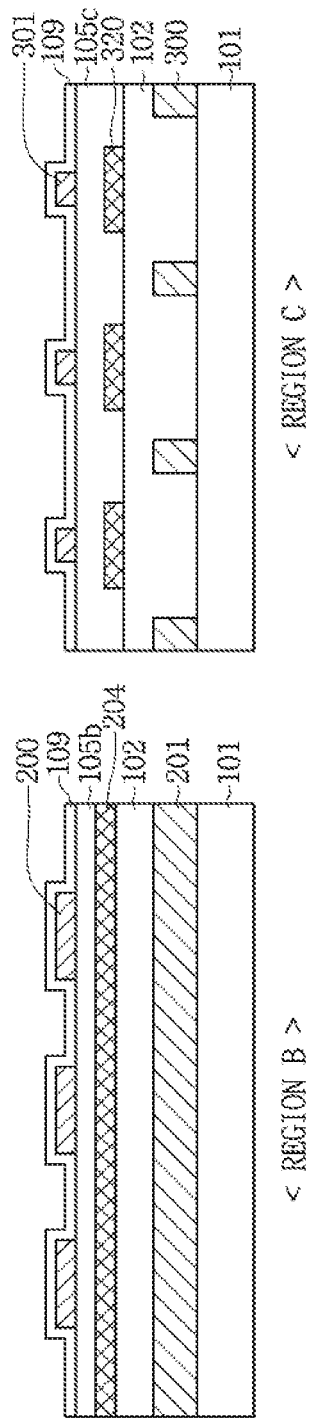

< PAD REGION >    < PIXEL REGION >

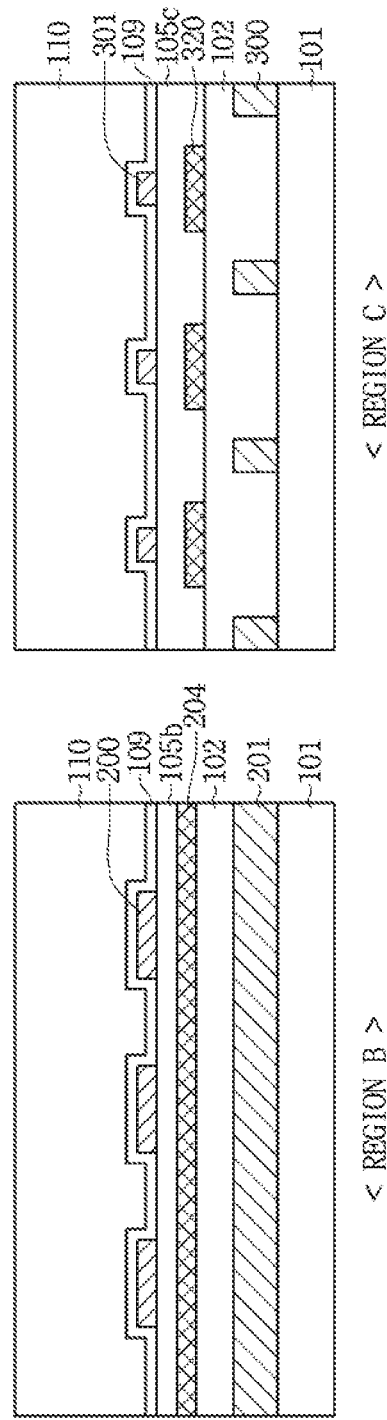

< PAD REGION >    < PIXEL REGION >

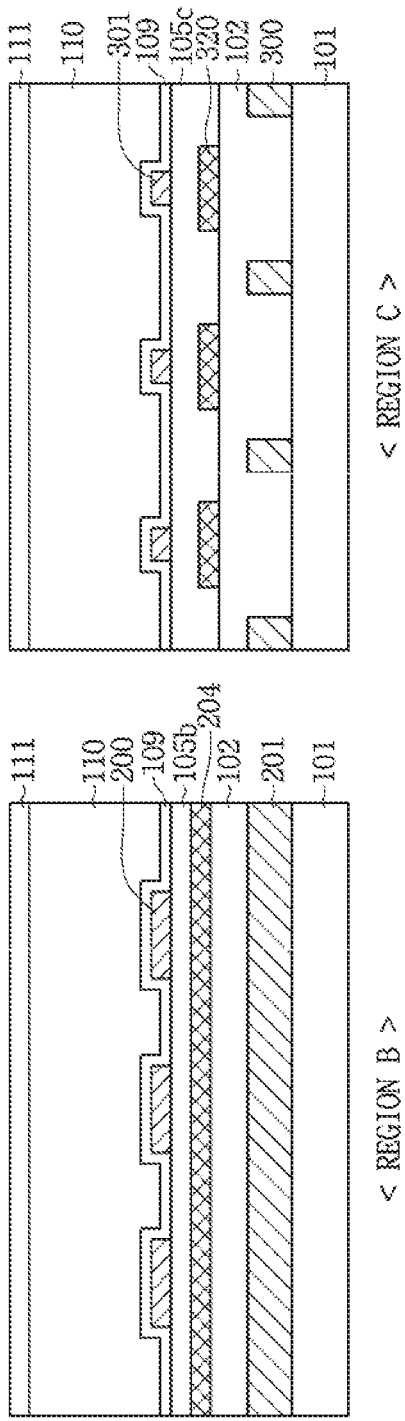

METHOD OF MAKING LIQUID CRYSTAL DISPLAY DEVICE WITH OXIDE THIN FILM TRANSISTOR

This application is a Divisional of co-pending U.S. patent application Ser. No. 14/937,574 filed on Nov. 10, 2015, which claims the benefit under 35 U.S.C. §119(a) of Korean Patent Application No. 10-2014-0195832 filed on Dec. 31, 2014, all of which are hereby incorporated by reference in their entirety.

BACKGROUND OF THE INVENTION

Field of the Invention

Embodiments of the present invention relate to a liquid crystal display (LCD) device. And more particularly, the embodiments of the present invention relate to an LCD device with an oxide thin film transistor which is adapted to prevent a short defect between signal lines within a pad portion area of a display panel.

Description of the Related Art

In general, an LCD device displays images by controlling light transmittance of liquid crystal with dielectric anisotropy using an electric field. Such an LCD device includes a color filter substrate and a thin film transistor array substrate combined with having a liquid crystal layer therebetween. The color filter substrate is provided with a color filter array, and the thin film transistor array substrate is provided with a thin film transistor array.

In order to improve a narrow viewing angle of the LCD device, a variety of new modes applicable to the LCD device are being researched and developed. In accordance therewith, LCD devices being driven in one of an in-plane switching (IPS) mode, an optically compensated birefringence (OCB) mode, a fringe field switching (FFS) mode and so on, are being used as wide viewing angle LCD devices.

Among the wide viewing angle LCD devices, the IPS mode LCD device enables a lateral electric field to be generated between a pixel electrode and a common electrode which are arranged on the same substrate. As such, major axes of liquid crystal molecules are aligned along a lateral direction parallel to the substrate. In accordance therewith, the IPS mode LCD device can provide a wider viewing angle compared to a twisted nematic (TN) mode LCD device of the related art.

FIG. 1 is a planar view showing an LCD device of the related art. FIG. 2 is a cross-sectional view largely showing a region A in FIG. 1.

Referring to FIGS. 1 and 2, the related art LCD device is defined into a display area DA and a pad area PDA surrounding the display area DA. The display area DA can be defined into a plurality of pixel regions PX.

The pixel regions PX can be defined by pluralities of gate lines GL and data lines DL crossing each other. Also, thin film transistors are disposed at intersections of the gate lines GL and the data lines DL. Moreover, a pixel electrode and a common electrode are disposed in each of the pixel regions PX.

Meanwhile, a gate pad portion GPP and a data pad portion DPP are disposed in the pad area PDA. The gate pad portion GPP and the data pad portion DPP is used to receive gate driving voltages and data voltages from an external system.

Such gate and data pad portions GPP and DPP each include a plurality of pads. The plural pads of the gate pad portion GPP and the plural pads of the data pad portion DPP can be connected to ends of the gate lines GL and the data lines DL which are arranged in the display area DA.

To this end, not only gate link lines are arranged between the gate pad portion GPP and the gate line GL on the display area DA but also data link lines are arranged between the data pad portion DPP and the data lines DL on the display area DA. The gate link lines can be formed either in a single body united with the respective gate line GL or in a different layer from the respective gate line GL. The data link lines can be formed in the same shape as the gate link lines.

Referring to FIG. 2, a gate link line 11 is disposed in the pad area PDA of a substrate 10. The gate link line 11 is formed in the same layer as the respective gate line GL which are arranged on the display area DA of the substrate 10. Also, common voltage lines 21 are arranged above the gate link line 11 in such a manner as to cross the gate link line with having a gate insulation film 12 and an interlayer insulation film 13. Moreover, a first passivation film 14, a planarization film 15 and a second passivation film 16 are sequentially formed on the substrate 10 provided with the common voltage lines 21.

However, a foreign substance P can be stained on the gate link line 11. In this case, a fault pattern can be generated when the gate insulation film 12 and the interlayer insulation film 13 are formed on the substrate 10 stained with the foreign substance P. In other words, the fault pattern can be generated by the foreign substance P during depositions of the gate insulation film 12 and the interlayer insulation film 13.

Such a fault pattern can cause a short defect to be generated between the gate link line 11 and the common voltage line 21.

Also, although the short defect due to the foreign substance P is not generated, an abnormal electric potential can be generated between the common voltage line 21 and the gate link line 11 within a region in which the foreign substance P exists. Due to this, signal distortion can be caused by the foreign substance P.

SUMMARY OF THE INVENTION

Accordingly, embodiments of the present application are directed to an LCD device that substantially obviates one or more of problems due to the limitations and disadvantages of the related art.

The embodiments are to provide an LCD device with an oxide thin film transistor which is adapted to prevent a short defect between signal lines crossing each other within a pad area of a display panel by disposing a protective pattern in the pad area.

Also, the embodiments are to provide an LCD device with an oxide thin film transistor which is adapted to prevent a short defect between signal lines, which cross each other within a pad area of a display panel, due to a foreign substance generated during a fabrication procedure, by disposing a protective pattern in the pad area at formation of a channel layer of the oxide thin film transistor.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems, an LCD device with an oxide thin film transistor according to a general aspect of the embodiment of the present invention includes a substrate defined into a display area, which is distinguished into a plurality of pixel regions, and a pad area surrounding the display area, gate and data pad portions disposed in the pad area, first and second signal lines arranged to cross each other in a first region between the gate pad portion and the display area with having a first insulation film therebetween, third and fourth signal lines arranged to cross each other in a second region between the data pad portion and the display area with having a second insulation film therebetween, a first protective pattern interposed between the first and second signal lines within the first region, and a second protective pattern interposed between the third and fourth signal lines within the second region. Such an LCD device can prevent a short defect between the signal lines.

According to an embodiment of the present invention, a display device includes: a substrate having a display area and a pad area in a periphery of the display area, the display area including a plurality of pixel regions; a thin film transistor having a channel layer, and on the substrate; a gate link line and a first common voltage line arranged to cross each other, and having a first insulation film interposed therebetween; a second common voltage line and a data link line arranged to cross each other, and having second insulation film interposed therebetween; a first pattern disposed on the first insulation film; and a second pattern disposed on the second insulation film, wherein the channel layer, the first pattern and the second pattern are formed of the same material.

According to an embodiment of the present invention, a method of making a display device includes: providing a substrate having a display area and a pad area in a periphery of the display area, the display area including a plurality of pixel regions; forming a thin film transistor having a channel layer on the substrate; arranging a gate link line and a first common voltage line to cross each other, and having a first insulation film be interposed therebetween; arranging a second common voltage line and a data link line to cross each other, and having second insulation film be interposed therebetween; disposing a first pattern on the first insulation film; and disposing a second pattern on the second insulation film, wherein the channel layer, the first pattern and the second pattern are formed of the same material.

According to an embodiment of the present invention, a display device includes: a substrate having a display area and a pad area in a periphery of the display area; a gate insulation film on the substrate; a thin film transistor having a channel layer on the substrate; a data pad portion disposed in the pad area; and a pattern disposed on the gate insulation film in the data pad portion, wherein the channel layer and the pattern are formed of the same material.

Other systems, methods, features and advantages will be, or will become, apparent to one with skill in the art upon examination of the following figures and detailed description. It is intended that all such additional systems, methods, features and advantages be included within this description, be within the scope of the present invention, and be protected by the following claims. Nothing in this section should be taken as a limitation on those claims. Further aspects and advantages are discussed below in conjunction with the embodiments. It is to be understood that both the foregoing general description and the following detailed description of the embodiments of the present invention are by example and explanatory and are intended to provide further explanation of the embodiments of the present invention as claimed.

BRIEF DESCRIPTION OF THE DRAWINGS

The accompanying drawings, which are included to provide a further understanding of the embodiments and are incorporated herein and constitute a part of this application, illustrate embodiment(s) of the present invention and together with the description serve to explain the invention. In the drawings.

DETAILED DESCRIPTION OF THE EMBODIMENTS

Figure 1:
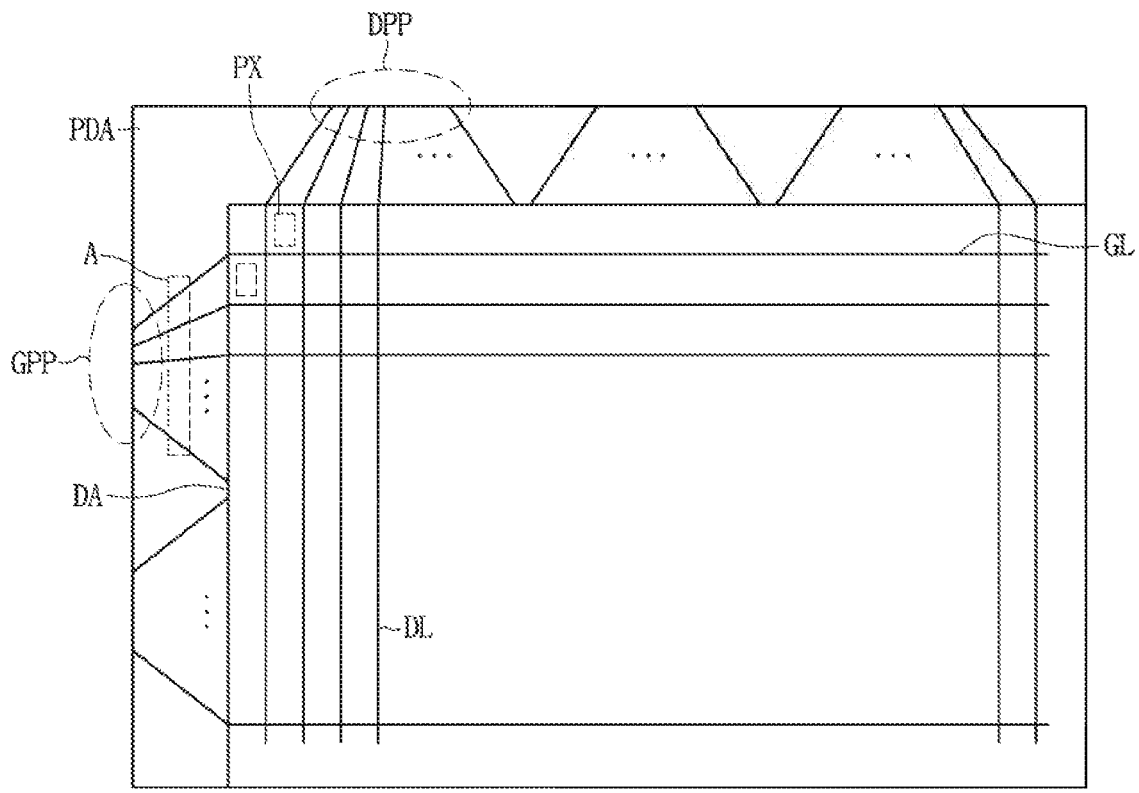
FIG. 1 is a planar view showing an LCD device according to the related art.

Advantages and features of the embodiments of the present invention, and implementation methods thereof will be clarified through the following embodiments described with reference to the accompanying drawings. These embodiments introduced hereinafter are provided as examples in order to convey their spirits to the ordinary skilled person in the art. As such, these embodiments might be embodied in a different shape, so are not limited to these embodiments described here. Therefore, the embodiments of the present invention must be defined by scopes of claims.

In the following description, numerous specific details are set forth, such as particular structures, sizes, ratios, angles, coefficients and so on, in order to provide an understanding of the various embodiments of the present invention. However, it will be appreciated by one of ordinary skill in the art that the various embodiments of the present invention may be practiced without these specific details. The same reference numbers will be used throughout this invention to refer to the same or like parts. In other instances, well-known technologies have not been described in detail in order to avoid obscuring the embodiments of the present invention.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the singular forms "a", "an" and "the" are intended to include the plural forms as well, unless the context clearly indicates otherwise.

Elements used in the embodiments of the present invention without additional specific details may be considered to include generic features.

In the description of embodiments of the present invention, when a structure is described as being positioned "on or above" or "under or below" another structure, this description should be construed as including a case in which the structures contact each other as well as a case in which a third structure is disposed therebetween.

The temporal terms of "after", "subsequently", "next", "before" and so on used in this invention without specifying "immediately" or "directly" can include other discontinuous temporal relations.

Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of example embodiments.

The features of various example embodiments of the present invention may be partially or entirely bound or combined with each other, and be technically engaged and driven using various methods as apparent to those skilled in the art, and the example embodiments may be independently practiced alone or in combination.

Reference will now be made in detail to the embodiments of the present invention, examples of which are illustrated in the accompanying drawings. In the drawings, the size, thickness and so on of a device can be exaggerated for the convenience of explanation. Wherever possible, the same reference numbers will be used throughout this invention including the drawings to refer to the same or like parts.

Figure 3:
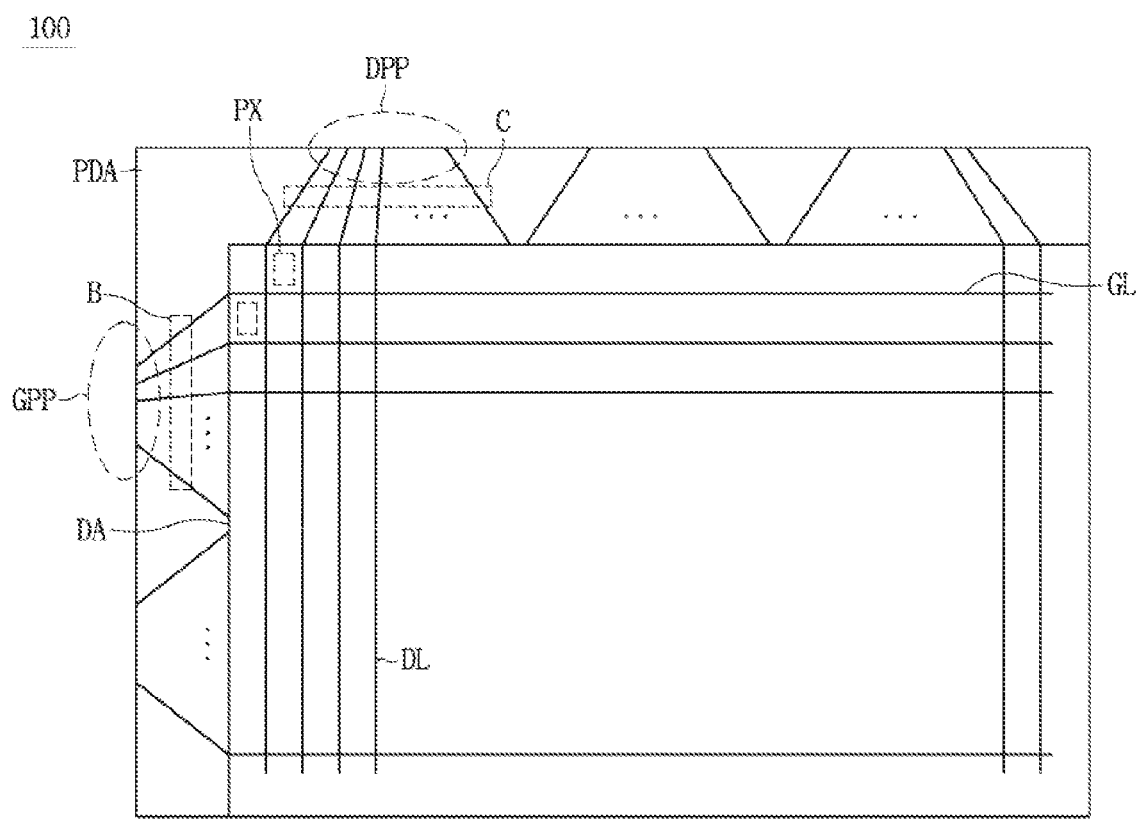
FIG. 3 is a planar view showing an LCD device according to an embodiment of the present invention.
Figure 4A:
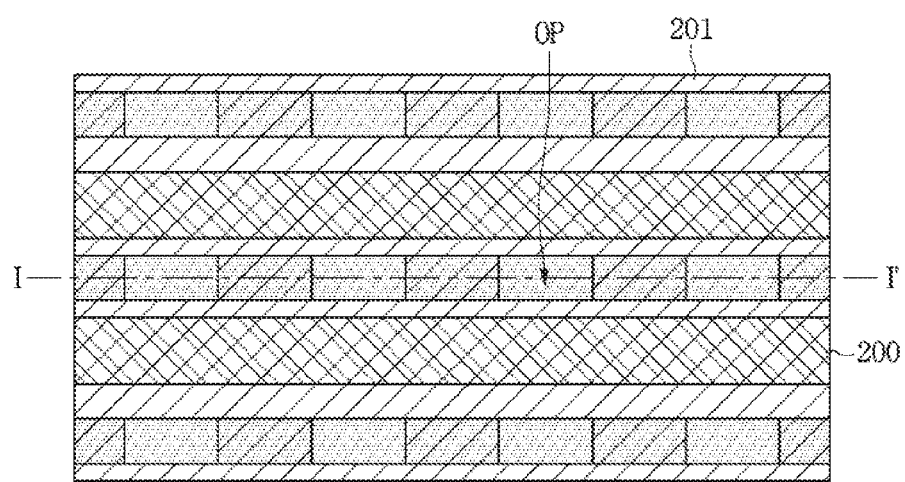
FIG. 4A is a planar view largely showing a region B in FIG. 3.
Figure 4B:
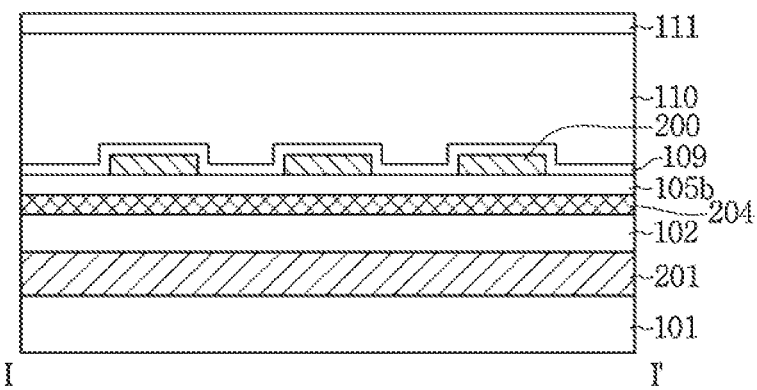
FIG. 4B is a cross-sectional view showing a sectional structure of the region B taken along a line I-I' in FIG. 4A.
Figure 5A:
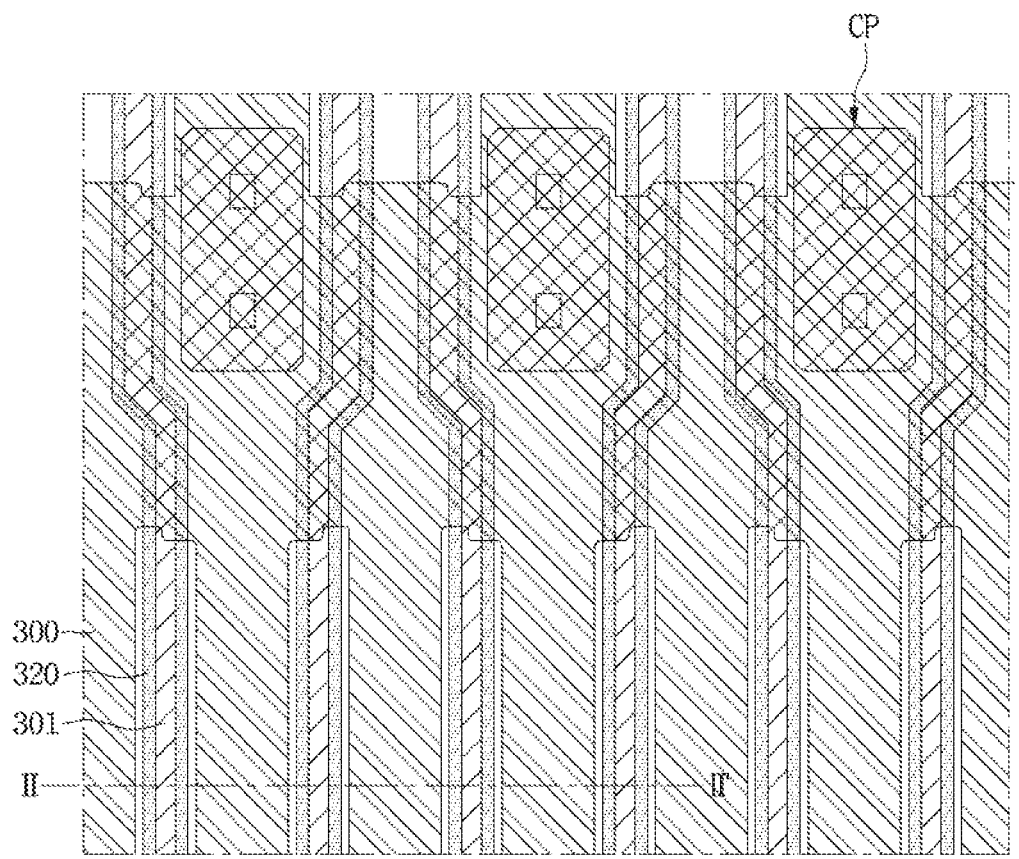
FIG. 5A is a planar view largely showing another region C in FIG. 3.
Figure 5B:
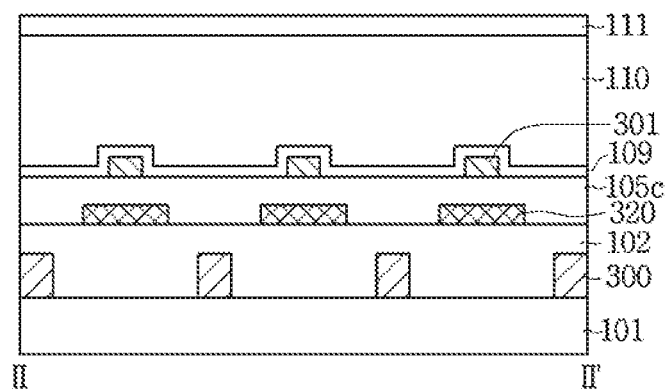
FIG. 5B is a cross-sectional view largely showing a sectional structure of the region C taken along a line II-II' in FIG. 5A.

FIG. 3 is a planar view showing an LCD device according to an embodiment of the present invention. FIG. 4A is a planar view largely showing a region B in FIG. 3. FIG. 4B is a cross-sectional view showing a sectional structure of the region B taken along a line I-I' in FIG. 4A. FIG. 5A is a planar view largely showing another region C in FIG. 3. FIG. 5B is a cross-sectional view largely showing a sectional structure of the region C taken along a line II-II' in FIG. 5A.

Referring to FIGS. 3 through 5B, an LCD device 100 according to an embodiment of the present invention is defined into a display area DA and a pad area PDA surrounding the display area DA. The display area is defined into a plurality of pixel regions PX. The pad area PDA can be defined into a gate pad area and a data pad area.

The pixel regions PX are defined by pluralities of gate lines GL and data lines DL crossing each other. Thin film transistors are disposed at intersections of the gate lines GL and the data lines DL. A pixel electrode and a common electrode can be disposed in each of the pixel regions PX.

Also, a gate pad portion GPP and a data pad portion DPP are disposed in the pad area PDA. The gate pad portion GPP is used to receive gate driving voltages from an external system. The data pad portion DPP is used to receive data driving voltages from the external system.

A plurality of signal lines is arranged in a part of the pad area DPA between the gate and data pad portions GPP and DPP and the display area DA. The plurality of signal lines can overlap with or cross each other with having at least one insulation film therebetween. The plurality of signal lines can include gate link lines, data link lines and common voltage lines, which are arranged in the pad area PDA.

The gate pad portion GPP and the data pad portion DPP can be each configured with a plurality of sub-pad portions. Also, the gate pad portion GPP and the data pad portion DPP each include a plurality of pads. The pads can be connected to respective ends extended from the gate lines GL and the data line DL which are arranged in the display area DA.

To this end, the gate link lines can be arranged in a region B (hereinafter, "first link region B") between the gate pad portion GPP and the gate lines GL of the display area DA. The gate link lines can be used as signal lines for transferring gate driving voltages. Also, the data link lines can be arranged in another region C (hereinafter, "second link region C") between the data pad portion DPP and the data lines DL of the display area DA. The data link lines can be used as signal lines for transferring data driving voltages.

Such gate link lines can either be each formed in a single body united with the respective gate lines GL. Alternatively, the gate link lines can become lines which are formed in a different layer from the gate lines GL. Also, the data link lines can be formed in the same shape as the gate link lines.

As shown in FIGS. 4A and 4B, a plurality of gate link lines 201 is arranged in the first link region B of a substrate 101. A gate insulation film 102 covering the gate link lines 201 is disposed in the first link region B of the substrate 101. A first protective pattern 204 is disposed on the gate insulation film 102 within the first link region B, and a first interlayer insulation film pattern 105$b$ is disposed on the protective pattern 204.

Also, a plurality of first common voltage lines 200 is arranged on the first interlayer insulation film pattern 105$b$. The common voltage lines 200 are arranged in such a manner as to cross the plurality of gate link lines 201 formed on the substrate 101. In order to prevent a short phenomenon due to static electricity, openings OP are formed in regions of each gate link line 201 which overlap with the common voltage lines 200.

The first protective pattern 204 according to the embodiment of the present invention is interposed between the first common voltage lines 200 and the gate link lines 201. In accordance therewith, the short defect due to a foreign substance existing between the first common voltage line 200 and the gate link line 201 can be prevented.

The first protective pattern 204 can become a semiconductor layer which is used for forming a channel layer of a thin film transistor within the display area DA. The semiconductor layer can be formed from an oxide semiconductor.

The first interlayer insulation film pattern 105$b$ interposed between the first common voltage line 200 and the first protective pattern 204 can be prepared by patterning an interlayer insulation film which covers the channel layer of the thin film transistor in the display area DA. As needed, the first interlayer insulation film pattern 105$b$ can be formed in a single body united with the interlayer insulation film within the display area DA.

Moreover, a first passivation film 109, a planarization film 110 and a second passivation film 111 are sequentially stacked in such a manner as to cover the first common voltage lines 200.

In this manner, the embodiment of the present invention allows the first protective pattern 204 to be disposed in a part of a gate pad area which is occupied by the first common voltage lines 200 and the gate link lines 201 with the exception of the gate pad portion GPP. Also, the first protective pattern 204 is interposed between the first common voltage lines 200 and the gate link lines 201. The generation of a short defect between the signal lines due to faults of the gate insulation film 102 and the first interlayer insulation film pattern which are caused by a foreign substance generated at formation of the gate link lines 201 can be prevented. Alternatively, the first protective pattern 204 can be formed in such a manner as to be divided into a plurality of portions which is disposed in respective cross regions of the gate link lines 201 and the first common voltage lines 200.

Figure 2:
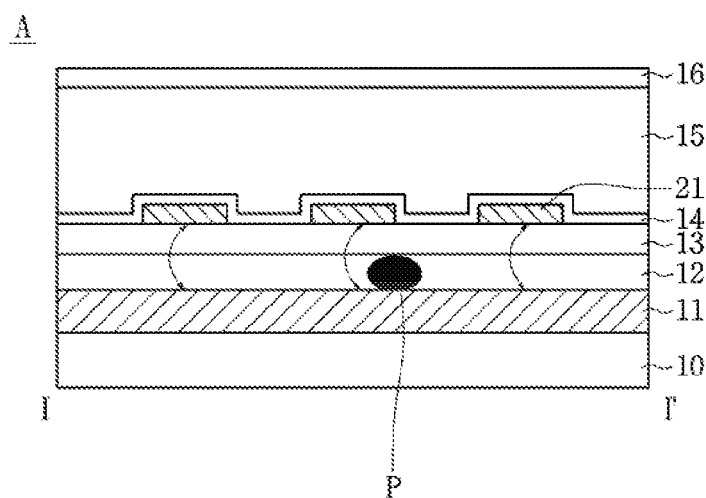
FIG. 2 is a cross-sectional view showing a region A in FIG. 1.

If a foreign substance P is generated at the formation of the gate link lines 201 as shown in FIG. 2, growth of the gate insulation film 102 and the first interlayer film pattern 105*b* must be concentrated onto the foreign substance region. Due to this, crack faults can be generated in the gate insulation film 102 and the first interlayer insulation film pattern 105*b*. Such crack faults can cause a short defect between the first common voltage line 200 on the first interlayer insulation film pattern 105*b* and the gate link line 201 under the gate insulation film 102 to be generated.

However, the LCD device according to the embodiment of the present invention interposes the first protective pattern 204 between the gate insulation film 102 and the first interlayer insulation film pattern 105*b*. In accordance therewith, any short defect between the signal lines (i.e., the gate link line 201 and the first common voltage line 200) can be prevented.

Also, the first protective pattern 204 is formed from the same oxide semiconductor as the channel layer of the thin film transistor. As such, any signal distortion between the signal lines within the foreign substance region can be prevented.

Referring to FIGS. 5A and 5B, a plurality of second common voltage lines 300 electrically connected to the respective common electrodes is arranged in the second link region C of the substrate 101. The gate insulation film 102 covering the second common voltage lines 300 is disposed on the substrate 101. Also, second protective patterns 320 are arranged on the gate insulation film 102 corresponding to the second link region C, and a second interlayer insulation film pattern 105*c* covering the second protective patterns 320 is disposed on the gate insulation film 102 corresponding to the second link region C. Moreover, data link lines 301 are arranged on the second interlayer insulation film pattern 105*c*.

The second common voltage lines 300 can be simultaneously formed when the gate lines GL within the display area DA are patterned. Also, the second common voltage lines 300 can be electrically connected to the respective common electrodes within the display area DA by means of respective contact points CP which are formed at formation of the common electrodes.

The second protective patterns 320 included in the LCD device of the embodiment of the present invention are interposed between the respective second common voltage lines 300 and the respective data link lines 301. As such, any short defect due to a foreign substance which exists between the second common voltage line 300 and the data link line 301 can be prevented.

Although the second protective patterns 320 within the second link region C is each formed in an overlapping shape with only the respective data link lines 301, it is not limited to this. Alternatively, the second protective patterns can be formed in a single plate shape, like the first protective pattern 204 in the first link region B. In other words, the second protective pattern 320 with the single plate shape can be disposed in an entire area occupied by the data link lines 301 and the second common voltage lines 300.

The second protective pattern 320 can become a semiconductor layer which is used for forming the channel layer of the thin film transistor within the display area DA. The semiconductor layer can be formed from an oxide semiconductor.

Furthermore, the first passivation film 109, the planarization film 110 and the second passivation film 111 are also sequentially stacked on the second interlayer insulation film pattern 105*c* provided with the data link lines 301.

In this way, the embodiment of the present invention allows the second protective patterns 320 to be disposed in cross regions of the second common voltage lines 300 and the data link lines 301 within the data pad area. Also, the second protective patterns 320 are interposed between the second common voltage lines 300 and the data link lines 301. The generation of a short defect due to a foreign substance which is caused by formation processes of the gate insulation film 102 and the second interlayer insulation film pattern 105*c* can be prevented.

Also, the second protective patterns 320 are formed from the same oxide semiconductor as the channel layer of the thin film transistor. As such, any signal distortion between the signal lines within the foreign substance region can be prevented.

FIGS. 6A through 9B are cross-sectional views illustrating a method of fabricating an LCD device according to an embodiment of the present invention.

Referring to FIGS. 6A through 9B, a fabrication method of an LCD device according to the embodiment of the present invention prepares a substrate 101 defined into a pixel region and a pad area. The pad area is defined a pad region, a first link region B and a second link region C. The pad region is occupied by a pad which is included in one of the gate pad portion GPP and the data pad portion DPP. The first link region B is occupied by the gate link lines 200, and the second link region C is occupied by the data link lines 300. For the convenience of explanation, not only the pad region and the pixel region are shown in FIGS. 6A, 7A, 8A and 9A but also the first and second link regions B and C are shown in FIGS. 6B, 7B, 8B and 9B.

Also, a pad formed in the pad region can be connected to one of the first and second common voltage lines 200 and 300, the gate link line 201 and the data link line 301. However, for the convenience of explanation, it will be described that a pad connected to the second common voltage line 300 shown in FIGS. 5A and 5B is formed in the pad region as an example.

Figure 6A:
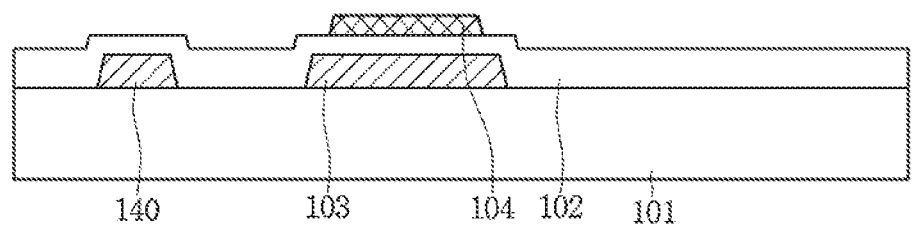
FIGS. 6A through 9B are cross-sectional views illustrating a method of fabricating an LCD device according to an embodiment of the present invention.
Figure 6B:
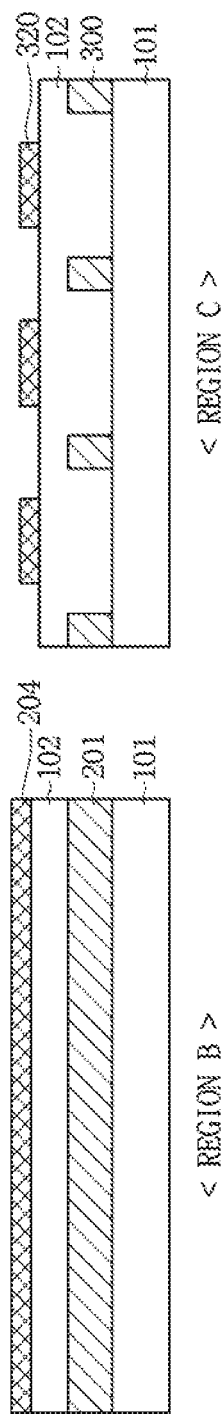

A metal film is formed on the substrate 101 and then a first mask procedure is performed for the metal film. As such, a gate electrode 103, a second common voltage line pad 140, a gate link line 201 and a second common voltage line 300 are formed as shown in FIGS. 6A and 6B. The gate electrode 103 is disposed in the pixel region, the second common voltage line pad 140 is disposed in the pad region, the gate link line 201 is disposed in the first link region B, and the second common voltage line 300 is disposed in the second link region C.

Also, a gate insulation film 102 is formed on the entire surface of the substrate 101 which is provided with the gate electrode 103, the second common voltage line pad 140, the gate link line 201 and the second common voltage line 300. The gate insulation film 102 can be formed from one of a silicon-nitride (SiNx) based insulation material and a silicon-oxide ($SiO_2$) based insulation material.

The metal film used in the formation of the gate electrode 103 can be formed from an opaque conductive material with a low resistance. For example, the metal film for the gate electrode 103 can be formed from one of aluminum Al, an aluminum alloy (Al-alloy), tungsten W, copper Cu, nickel Ni, chromium Cr, molybdenum Mo, titanium Ti, platinum Pt, tantalum Ta and so on. Alternatively, the metal film for the gate electrode 103 can be formed from a multi-layered structure in which at least one transparent conductive material layer and at least one opaque conductive material layer are stacked. In this case, the transparent conductive material layer can be formed from one of indium-tin-oxide (ITO), indium-zinc-oxide (IZO) and so on.

After the gate electrode 103 and the gate insulation film 102 are formed on the substrate 101 as described above, an oxide semiconductor layer is formed on the above-mentioned substrate 101 and then a patterning process is performed for the oxide semiconductor layer. As such, a channel layer 104, a first protective pattern 204 and second protective patterns 320 are formed on the gate insulation film 102. The channel layer 104 is disposed on the gate insulation film 102 opposite to (or overlapping with) the gate electrode 103. The first protective pattern 204 is disposed on the gate insulation film 102 within the first link region B. The second protective patterns 320 are arranged on the gate insulation film 102 within the second link region C. The detailed structures of the first and second protective patterns 204 and 320 are shown FIGS. 4A, 4B, 5A and 5B.

The oxide semiconductor layer can be formed from an amorphous oxide containing at least one of indium In, zinc Zn, gallium Ga and hafnium Hf. If a Ga—In—Zn—O semiconductor layer is formed through a sputtering process, either targets formed from $In_2O_3$, $Ga_2O_3$ and ZnO or a single target formed from Ga—In—Zn oxide can be used in the sputtering process. Alternatively, when an Hf—In—Zn—O semiconductor layer is formed through a sputtering process, either targets formed from $HfO_2$, $In_2O_3$ and ZnO or a single target formed from Hf—In—Zn oxide can be used in the sputtering process.

Figure 7A:
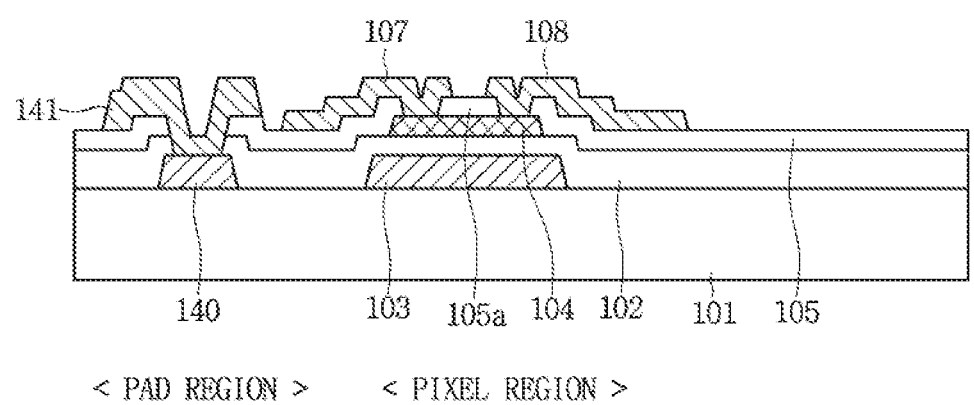

As shown in FIGS. 7A and 7B, an interlayer insulation film 105 is formed on the entire surface of the substrate 101 in which the channel layer 104, the first protective pattern 204 and the second protective patterns 320 are arranged. Then, a second mask procedure is performed for the interlayer insulation film 150. In accordance therewith, the channel layer 104 and the second common voltage line pad 140 are partially exposed. At the same time, an etch stopper 105a and first and second interlayer insulation film patterns 105b and 105c are formed. The etch stopper 105a is disposed on the channel layer 104, the first interlayer insulation pattern 105b is disposed on the first protective pattern 204 within the first link region B, and the second interlayer insulation pattern 105c covers the second protective patterns 320 on the gate insulation film 201 within the second link region C.

The first and second interlayer insulation film patterns 105b and 105c can be formed in a single body united with the interlayer insulation film 105. Alternatively, the first and second interlayer insulation film patterns 105b and 105c can be formed in such a manner as to be separate from the interlayer insulation film 105.

Thereafter, a source/drain metal film is formed on the entire surface of the above-mentioned substrate 101 and a third mask procedure is performed for the source/drain metal film. As such, source and drain electrodes 107 and 108, data lines, data link lines 301, first common voltage lines 200 and a first contact electrode 141 are simultaneously formed.

The source/drain metal film can be formed from an opaque conductive material with a low resistance. For example, the source/drain metal film can be formed from one of aluminum Al, an aluminum alloy (Al-alloy), tungsten W, copper Cu, nickel Ni, chromium Cr, molybdenum Mo, titanium Ti, platinum Pt, tantalum Ta and so on. Alternatively, the source/drain metal film can be formed from a multi-layered structure in which at least one transparent conductive material layer and at least one opaque conductive material layer are stacked. In this case, the transparent conductive material layer can be formed from one of indium-tin-oxide (ITO), indium-zinc-oxide (IZO) and so on.

Figure 8A:
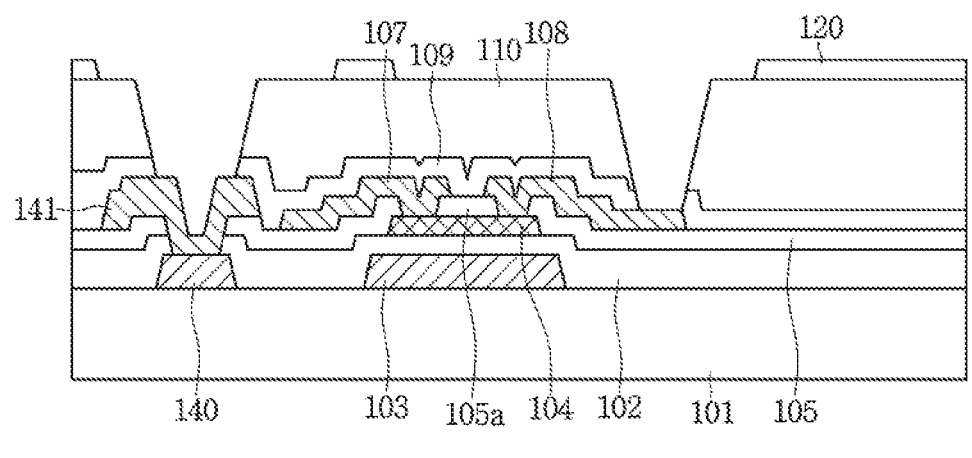
Figure 9A:
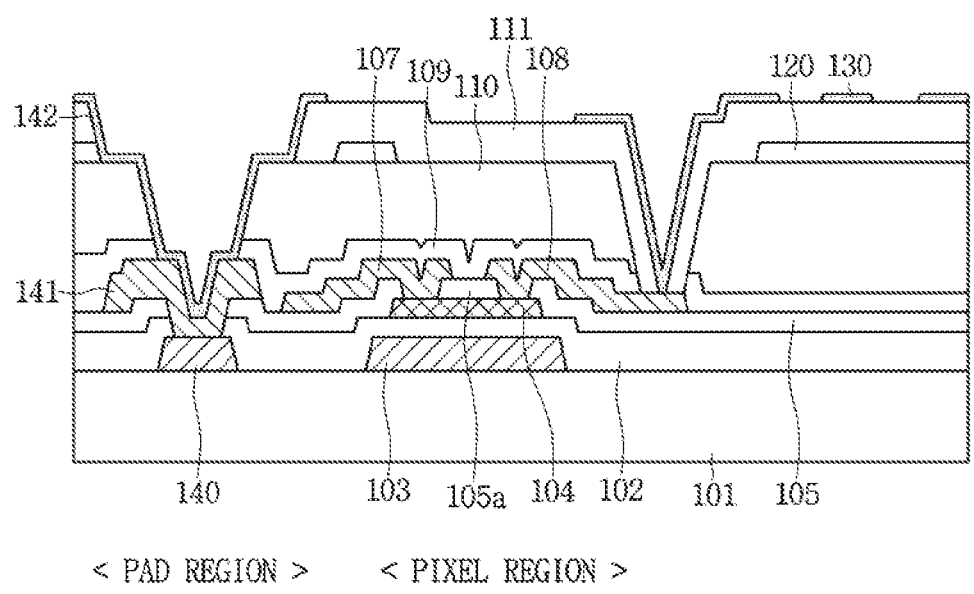

After the source and drain electrodes 107 and 108 are formed on the substrate 101 as described above, a first passivation film of a silicon-oxide based material is formed on the entire surface of the above-mentioned substrate 101 as shown in FIGS. 8A and 8B. Also, a planarization film 110 is formed on the entire surface of the substrate 101 provided with the first passivation film 109.

Subsequently, a fourth mask procedure is performed for the first passivation film 109 and the planarization film 110 stacked on the substrate 101, in order to partially expose the drain electrode 108 of the thin film transistor and the first contact electrode 141. Continuously, a first transparent conductive material film is formed on the entire surface of the substrate 101 which partially exposes the drain electrode 108 and the first contact electrode 141. The first transparent conductive material layer can be formed from one of indium-tin-oxide (ITO), indium-zinc-oxide (IZO) and indium-tin-zinc-oxide (ITZO).

Thereafter, a fifth mask procedure including an etch process is performed for the first transparent conductive material layer. In accordance therewith, a common electrode 120 is formed on the planarization film 110 within the pixel region as shown in FIG. 8A.

After the common electrode 120 is formed on the substrate 101, a second passivation film 111 is formed on the entire surface of the above-mentioned substrate 101. Also, a fifth mask procedure is performed for the second passivation film 111, in order to partially expose the drain electrode 108 of the thin film transistor within the pixel region and the first contact electrode 141 within the pad region.

Subsequently, a second transparent conductive material layer is formed on the entire surface of the above-mentioned substrate 101. Also, a sixth mask procedure is performed for the second transparent conductive material layer. As such, not only a pixel electrode 130 overlapping with the common electrode 120 formed in the pixel region but also a second contact electrode 142 being in contact with the first contact electrode 141 is formed in the pad region.

The second contact electrode 142 is electrically connected to the second common voltage line pad 140 through the first contact electrode 141. Also, the pixel electrode 130 is electrically connected to the drain electrode 108 of the thin film transistor.

Figure 10A:
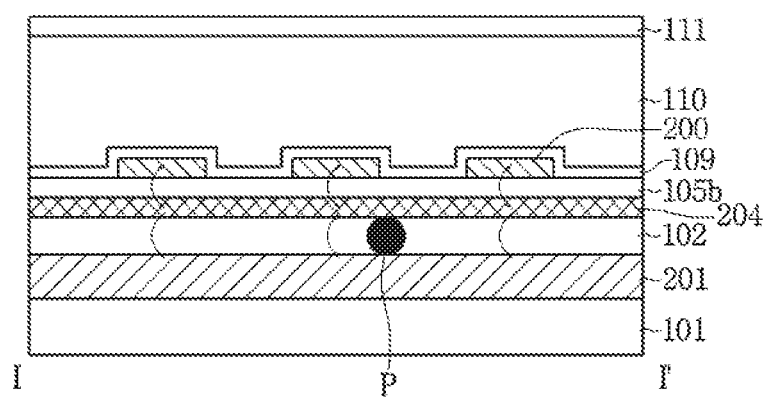
FIGS. 10A and 10B are cross-sectional views illustrating a principle which prevents any short defect between lines using protective patterns of the embodiment of the present invention arranged within a pad area.
Figure 10B:
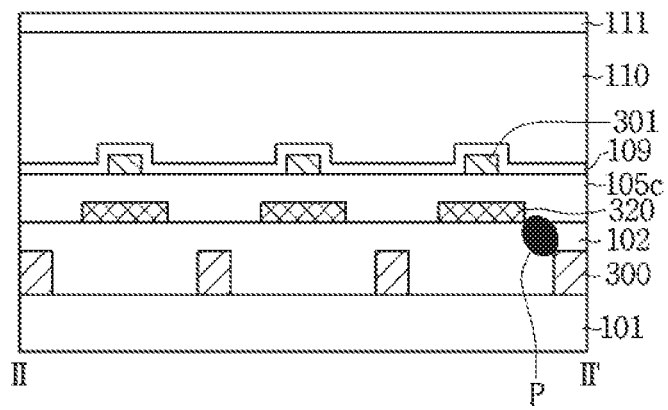

FIGS. 10A and 10B are cross-sectional views illustrating a principle which prevents any short defect between lines using protective patterns of the embodiment of the present invention arranged within a pad area.

Referring to FIG. 10A, a foreign substance P can exist in the gate insulation film 102 between the gate link line 201 and a first common voltage line 200. The foreign substance P primarily distorts an electric field of its circumstance when signals (or voltages) are transferred through the gate link line 201 and the first common voltage lines 200. The distortion of the electric field within the foreign substance region must cause the signals on the gate link line 201 and the first common voltage line 200 to be distorted.

However, the LCD device of the embodiment of the present invention allows the first protective pattern 204 of an oxide semiconductor to be interposed between the gate link line 201 and the first common voltage line 200. As such, the distortion of the electric field is hindered by the first protective pattern 204. Therefore, the signal distortion due to the foreign substance P can be prevented.

Also, the foreign substance P generated in the gate insulation film 102 causes a film fault by abnormally or excessively growing insulation films (including the gate insulation film 102) adjacently thereto during a following process. However, the first protective pattern 204 formed from an oxide semiconductor suppresses the abnormal or excessive growth of the insulation films. In accordance therewith, a short defect between the signal lines (i.e., the gate link line 201 and the first common voltage line 200) can be prevented.

Similarly, a foreign substance P can exist in the gate insulation film 102 covering the second common voltage lines 300 as shown in FIG. 10B. However, the second protective pattern 320 disposed under the data link line 301 intercepts the spread of the foreign substance P progressing toward the data link line 301.

In accordance therewith, the generation of signal distortion between the data link line 301 and the second common voltage line 300 can be prevented by the second protective pattern 320. Also, any short defect between the data link line 301 and the second common voltage line 300 crossing each other can be prevented by the second protective pattern 320.

A foreign substance P can exist in one of the first and second interlayer insulation film patterns 105b and 105c on the first and second protective patterns 204 and 320. In this case, the signal distortion and the short defect can be prevented by the above-mentioned principle.

As described above, the LCD device with the oxide thin film transistor according to the embodiment of the present invention allows a protective pattern to be interposed between the signal lines which cross each other within in the pad area of the display panel. As such, a short defect between the signal lines can be prevented by the protective pattern.

Also, the LCD device with the oxide thin film transistor according to the embodiment of the present invention enables the protective pattern to be formed within a pad area of the display panel, in which the signal lines crossing each other will be disposed, when the thin film transistor of the display panel is formed. In accordance therewith, the short defect between the signal lines due to a foreign substance which is generated in the fabrication procedure of the LCD device can be prevented.

The above-mentioned features, structures, effects and so on of the embodiment of the present invention are included in at least one embodiment without being limited to only a single embodiment. Moreover, it is apparent to the ordinary skilled person in the art that various variations and modifications are possible to the features, structures, effects and so on which are disclosed by the embodiments. Therefore, it is interpreted that such variations and modifications are included in the scope of the present invention.

Although the present invention has been limitedly explained regarding only the embodiments described above, it should be understood by the ordinary skilled person in the art that the present invention is not limited to these embodiments, but rather that various changes or modifications thereof are possible without departing from the spirit of the present invention. More particularly, various variations and modifications are possible in the component parts which are described in the embodiments. Accordingly, the scope of the present invention shall be determined only by the appended claims and their equivalents without being limited to the detailed description.

What is claimed is:

1. A method of making a display device, the method comprising:
   providing a substrate having a display area and a pad area in a periphery of the display area, the display area including a plurality of pixel regions;
   forming a thin film transistor having a channel layer on the substrate;
   arranging a gate link line and a first common voltage line to cross each other, and having a first insulation film be interposed therebetween;
   arranging a second common voltage line and a data link line to cross each other, and having second insulation film be interposed therebetween;
   disposing a first pattern on the first insulation film; and
   disposing a second pattern on the second insulation film,
   wherein the channel layer, the first pattern and the second pattern are formed of the same material.

2. The method of claim 1, further comprising forming a gate pad portion and a data pad portion in the pad area,
   wherein the gate link line and the first common voltage line cross each other in the gate pad portion, and the second common voltage line and the data link line cross each other in the data pad portion, and
   wherein the first pattern is disposed on the first insulation film in the gate pad portion, and the second pattern is disposed on the second insulation film in the data pad portion.

3. The method of claim 1, wherein the channel layer, the first pattern and the second pattern are formed of a semiconductor.

4. The method of claim 3, wherein the semiconductor is an oxide semiconductor.

5. The method of claim 1, wherein the channel layer, the first pattern and the second pattern are coplanar.

6. The method of claim 1, wherein the gate link line and the second common voltage line are formed on the substrate.

7. The method of claim 1, wherein the data link line is parallel to the second pattern.

* * * * *